United States Patent [19]

Kaufman et al.

[11] Patent Number: 4,851,778
[45] Date of Patent: Jul. 25, 1989

[54] ENHANCED S/N MRI FOR SHORT TR NUTATION SEQUENCES

[75] Inventors: Leon Kaufman; Chris Bragg, both of San Francisco, Calif.

[73] Assignee: The Regents of the University of California, Oakland, Calif.

[21] Appl. No.: 284,587

[22] Filed: Dec. 15, 1986

[51] Int. Cl.$^4$ .............................................. G01R 33/20
[52] U.S. Cl. ..................................... 324/309; 324/312
[58] Field of Search ............... 324/300, 307, 309, 312; 128/653

[56] References Cited

U.S. PATENT DOCUMENTS

| | | | |
|---|---|---|---|
| 4,297,637 | 10/1981 | Crooks et al. | 324/309 |
| 4,318,043 | 3/1982 | Crooks et al. | 324/309 |
| 4,471,305 | 9/1984 | Crooks et al. | 324/309 |
| 4,599,565 | 7/1986 | Hoenninger, III et al. | 324/309 |
| 4,689,563 | 8/1987 | Bottomley et al. | 324/309 |
| 4,689,564 | 8/1987 | Leue et al. | 324/312 |
| 4,694,254 | 9/1987 | Vatis et al. | 324/309 |
| 4,707,661 | 4/1987 | Hoenninger, III et al. | 324/309 |

OTHER PUBLICATIONS

Haase et al, "NMR Imaging of Spin-Lattice Relaxation Using Stimulated Echoes," J. Mag. Res. vol. 65, pp. 481–490 (1985).
Wehrli et al, "Mechanisms of Contrast in NMR Imaging," J. Com. Assisted Tom., 8(3):369–380, Jun. 1984.
Haase, "Localization of Unaffected Spins in MMR Imaging and Spectroscopy" (LOCUS Spectroscopy, Mag. Res. Med. vol. 3, pp. 963–968 (1986)
Matthael et al, "Multipurpose NMR Imaging Using Stimulated Echoes," Mag. Res. Med. Vol. 3, pp. 554–561 (1986).

Primary Examiner—Michael J. Tokar
Attorney, Agent, or Firm—Nixon & Vanderhye

[57] ABSTRACT

Where short TR MRI imaging sequences are required (e.g., for contrast media imaging), NMR signal strength losses are reduced by including an extra preparatory nutation pulse at an interval TR prior to the usual nutation sequence used to elicit an NMR RF response. The "dead time" during such a TR interval for one slice is utilized for eliciting and receiving NMR RF responses from at least one other slice and sending the extra preparatory nutation pulse into yet another slice thus effecting a multi-slice procedure with an effective TR less than the actual time between repetitions of a complete multi-slice projection sequence while yet retaining high signal strength.

12 Claims, 8 Drawing Sheets

FOR TR ≈ TE, $$I(SE) \cong N(H)f(v)e^{-TE/T2} \frac{\left[1-2e^{-(TR-3TE/2)/T1}+2e^{-(TR-TE/2)/T1}-e^{-TR/T1}\right]}{1-e^{-TR/T1} \cdot e^{-TR/T2}}$$

FOR TR >> TE, $$I(SE) \cong N(H)f(v)\left[1-e^{-TR/T1}\right]$$

where T1, T2 = NMR TISSUE PARAMETERS
TR = TIME BETWEEN REPEATING PULSE SEQUENCES
TE = TIME TO ECHO
N(H) = NUMBER OF HYDROGEN ATOMS PRESENT
f(v) = VELOCITY FUNCTION IF HYDROGEN ATOMS ARE IN MOTION

ENHANCED S/N MRI FOR SHORT TR NUTATION SEQUENCES

This invention is related to magnetic resonance imaging (MRI) utilizing nuclear magnetic resonant (NMR) phenomena. More particularly, this invention is directed towards method and apparatus for maintaining relatively high signal-to-noise ratios and relatively efficient time utilization in MRI imaging sequences requiring relatively short TR intervals. One particularly suitable application is for use in contrast media imaging where the contrast media shortens T1 and T2 NMR parameters of tissue being imaged and thus requires relatively short TR imaging sequences so as to distinguish the contrast media from normal somewhat longer T1 and T2 parameter tissues.

MRI is now in widespread commercial usage. Some examples of prior art MRI methods and apparatus may be found, for example, in prior issued commonly assigned U.S. Pat. Nos. 4,297,637; 4,318,043; 4,471,305; and 4,599,565. The contents of these referenced related patents are hereby incorporated by reference.

Because image quality is dependent upon signal-to-noise ratios and because MRI systems are relatively expensive to own and operate, constant efforts are made to improve (or at least maintain acceptable) signal-to-noise ratios while decreasing costs of MRI systems and/or improving the effective time utilization of the MRI system investment.

For example, as taught by Crooks et al (e.g., in the above referenced related patents), multi-slice imaging procedures may be used to make more effective time utilization of an MRI system during relatively long repetition intervals TR between MRI data gathering cycles. In brief, slice selective nutation pulses are used to elicit an NMR RF response from one of a number of slices after which a different slice is selectively addressed so as to elicit NMR responses from that slice while the first slice continues to relax during a relatively long TR interval towards its quiescent condition during the MRI protocol. After a succession of different slices are thus addressed and their individual NMR responses duly recorded, the entire measurement cycle is repeated (e.g., for the same sequence of slices but with different phase encoding) a considerable number of times (e.g., 256) so as to obtain the requisite number of phase encoded "projections" to use in various well-known MRI reconstruction algorithms. Accordingly, although a given slice is only accessed for a relatively small percentage of the overall time, other slices are accessed in the intervening "dead" time thus making the overall efficiency of the process much higher than otherwise would be possible (assuming that one actually wants to obtain images of all N-slices).

So-called "echo planar" MRI sequences are also known whereby many or all of the necessary MRI projection data are obtained in rapid sequence from a single or plural slice volumes. Here, it has been previously publicly suggested (e.g., by Crooks, in Montreal, 1986) that one might obtain better T1 tissue contrast by introducing an initial 90° nutation pulse into the slice(s) being imaged (e.g., so as to "spoil" the magnetization) and to then wait an effective TR period before the usual echo planar 90°–180° nutation pulses are used to initiate a train of spin echo NMR RF responses.

There have also been a number of prior art MRI sequences in which portions of data gathering cycles for one slice-volume are interleaved with those of other slice-volumes.

For example, in the above-referenced U.S. Pat. No. 4,297,637, a line scanning sequence used slice-selective 90° NMR RF nutation pulses in several parallel planes and then used slice-selective 180° NMR RF nutation pulses in two or more intersecting planes to collect a resulting train of NMR RF spin echo responses from the various lines of intersections between these selected slice-volumes.

Prior inversion recovery sequences are depicted in FIGS. 2A and 2B. There, a sequence of slice-selective 180° NMR RF nutation pulses are effected for a collection of parallel slice-volumes before the usual 90°–180°-SE sequences are used for each such slice-volume. FIG. 2A depicts a sequence involving three "interleaved" slices while FIG. 2B depicts a "singly" interleaved sequence (drawn so as to facilitate comparison to FIG. 6A). A further interleaved embodiment of this invention is also depicted at FIG. 6B to facilitate comparison to the FIG. 2A inversion recovery sequence.

The object in such "inversion recovery" sequences is to provide an inversion of the NMR spins by the 180° pulse, let such inverted spins recover for a time TI and then to image them. The entire process is repeated every TR time interval thus making the minimum TR twice TI. The number of slices per TI depends upon how many imaging times (90°–180°-SE) fit into a desired TI time. When longer TR is desired, the sequences may be "padded" out or additional slices included in the cascade. In the FIG. 2 example, three slices are included in each measurement cycle. If TR is to be about 4TI, then two sets of three slices may be imaged to yield six slices.

Haase et al ("NMR Imaging of Spin-Lattice Relaxation Using Stimulated Echoes", J. Mag. Res. 65, 481–490 (1985) is one example of a prior sequence used to measure T1. As shown in their FIG. 1, they use two 90° NMR RF nutation pulses (one possibly slice selective) and then use a limited flip angle to image either the same slice at multiple recovery times or to image several slices at different recovery times.

Wehrli et al ("Mechanisms of Contrast In NMR Imaging", J. Comput. Assist Tomagr., Vol 8, No. 3, 1984, pp 369–380) show a saturation recovery spin echo sequence in FIG. 3b which does not appear to involve more than one slice-volume but which does mention that the interpulse period (effectively TR) between 90° pulses in a 90°–90°–180° sequence can be made very short (e.g., less than 50 ms).

There are also other commercially available T1 measuring sequences offering several TR parameter values.

Recently, MRI contrast media have been approved for human use in a number of countries. In general, these media work by shortening the T1 and T2 NMR values associated with endogenous hydrogen present in tissues receiving the contrast media. So as to detect the tissues having such media, it is therefore necessary to use MRI sequences having relatively short TR (i.e., where TR is less than the normal tissue T1 NMR parameter). The shortening of T2 (e.g., with contrast media) acts to counteract the effect of T1 shortening. Therefore, effective NMR imaging sequences for use with contrast media must utilize relatively short time-to-echo (TE) NMR parameters if they are to realize the possible T1 contrast in the resulting MRI images.

Unfortunately, when the TR NMR parameter is on the order of the TE parameter, the NMR RF response signal strength may suffer a significant loss in accordance with the signal strength formulae known in the art (e.g., by Lin and by Ordendahl)

$$I(SE) = N(H)f(v)\exp(-TE/T2) \times$$
$$[1 - 2\exp(-TR - 3TE/2)/T1) + 2\exp(-(TR - TE/2)/T1) -$$
$$\exp(-TR/T1)]/$$
$$[1 - \exp(-TR/T1)\exp(-TR/T2)]$$

where
I(SE)=the intensity of the spin echo NMR RF response signal
N(H) represents the density of endogenous hydrogen nuclei
f(v)=a velocity dependent function if the NMR hydrogen nuclei are undergoing significant motion
TE is the time to echo from an initial NMR nutation
TR is the effective repetition interval between NMR measurement cycles
T1 and T2 are the usual NMR time constant parameters.

This formula assumes that T2 decay and dephasing during the TR time eliminate transverse magnetization. This means that no stimulated echoes are formed during the real echo time. The dephasing of the un-rephased 90° RF pulse helps in this regard. So do the slice selective gradient pulses for any other 90° RF pulses that are interleaved.

Upon suitable analysis, it will be appreciated that signal strength of an NMR RF response is lost when a 180° nutation pulse is located between 90° nutation pulses so as to reduce the effective TR parameter. As will also be appreciated, any loss in signal strength represents a loss in the signal-to-noise ratio relevant to image quality.

So as to avoid such signal degradation, we have devised a new multi-slice MRI imaging procedure for use with a short TR. Namely, the effective TR may be made arbitrarily less than the actual TR for a multi-slice MRI sequence.

In brief summary, instead of eliciting spin echo (SE) NMR responses by using a succession of only 90°–180° nutation pulses (where the effective TR is given by the time elapsed between 90° nutation pulses), our exemplary embodiment uses a sequence of 90°–90°–180° pulses for each slice where the effective TR is defined by the interval between the first and second 90° nutation pulses and where TE/2 is the time between the second 90° nutation pulse and the 180° nutation pulse (thus increasing the time between each 180° nutation pulse and the next 90°–180° nutation pulse sequence by introducing the extra 90°−TR time interval and thus avoiding inherent signal loss for short TR sequences). At the same time, the "dead time" beteen the 90° nutation pulses (i.e., during the TR interval) can be advantageously used by (a) eliciting and receiving NMR responses from *other* slice volume(s) to be imaged. (b) *and* by initiating similar sequences in yet *other* slice- volume(s) to be imaged. In this manner, the actual TR of a given complete multi-slice cycle can be as long as necessary to acquire an MRI data projection from any desired number of slice volumes and at the same time as long as necessary for the effect of the 180° pulse to be "forgotten" by the system—without affecting the effective TR (i.e., the TR NMR parameter related to T1 and NMR response signal strength).

This short TR multi-slice sequence permits acquisition of MRI data from multi-slice volumes in a very time efficient manner while still providing a relatively short effective TR parameter (e.g., so as to enhance contrast media images) and while providing signal-to-noise ratios that are considerably improved (e.g., 30 to 40 percent) over similar effective TR parameter sequential single slice volume sequences.

Although the preferred exemplary embodiment utilizes a pair of 90° NMR RF nutation pulses followed by a 180° NMR RF nutation pulse, the initial nutation pulse angles may be other than 90°. For example, the first nutation pulse may be 90°−α and the second 90°+β so that, in combination with the 180° pulse, it acts like a small flip angle.

Furthermore, the 180° nutation effected at TE/2 may be achieved by known magnetic gradient pulse reversal techniques as an alternative to the exemplary embodiment wherein a 180° NMR RF nutation pulse is utilized.

Still furthermore, although the multi-slice data acquisition sequence may access contiguous slice volumes sequentially, any other desired order is also feasible. If the "dead time" effective TR interval between the initial pair of nutation pulses (e.g., ϕ° which are preferably 90°) is sufficiently long, then more than one or two other slice-volumes may be interrogated to begin or finish MRI measurement cycles during that interval. These as well as other objects and advantages of this invention will be more completely appreciated and understood by reading the following detailed description of presently preferred exemplary embodiments of this invention taken in conjunction with the accompanying drawings, of which:

The novel data acquisition procedure utilized by this invention typically can be achieved by suitable alteration of stored controlling computer programs in existing MRI apparatus. As an example of such typical apparatus, the block diagram of FIG. 1 depicts the general architecture of such a system.

Figure 1:
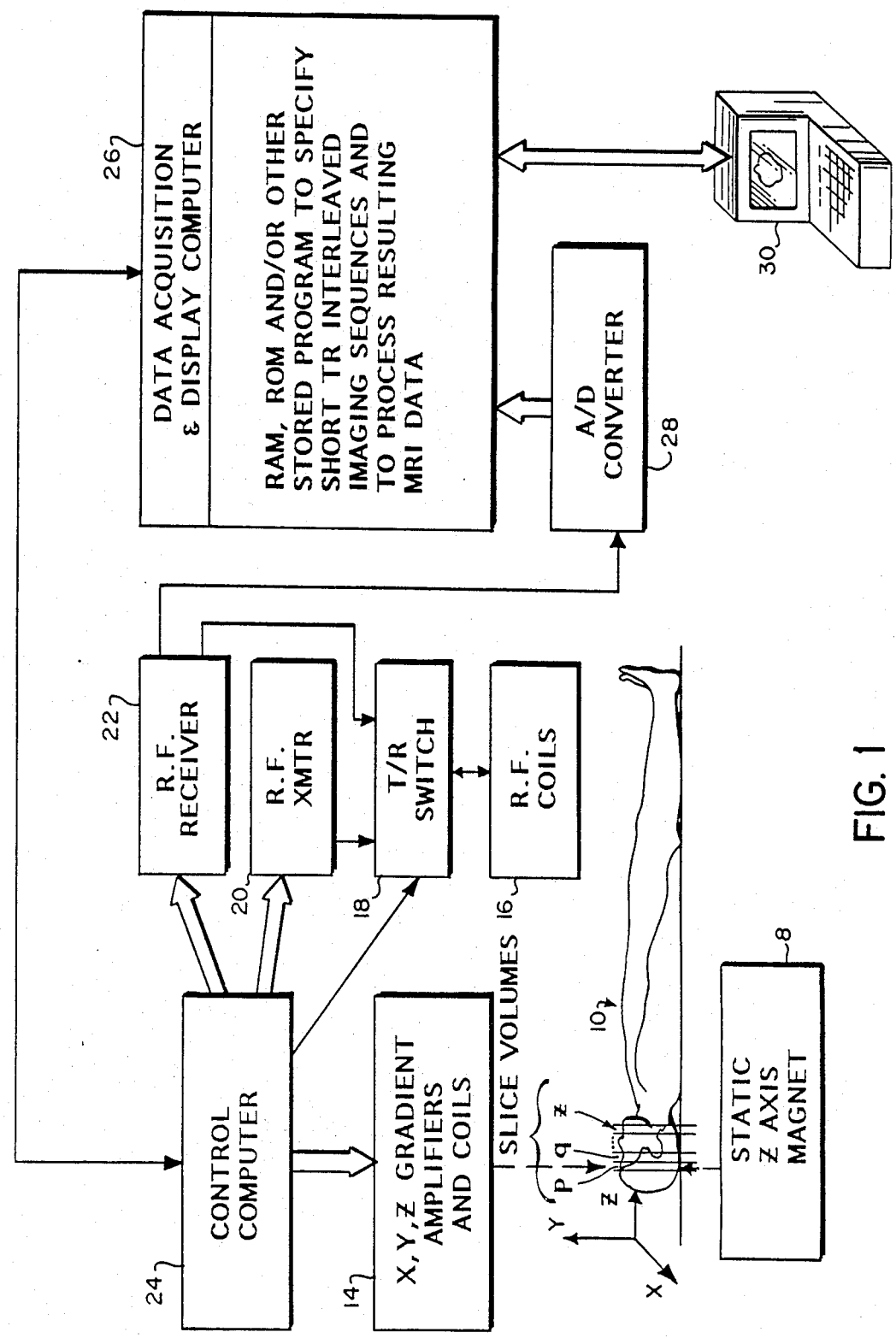
FIG. 1 is a generalized schematic block diagram of an overall MRI system utilizing this invention.
Figure 2A:
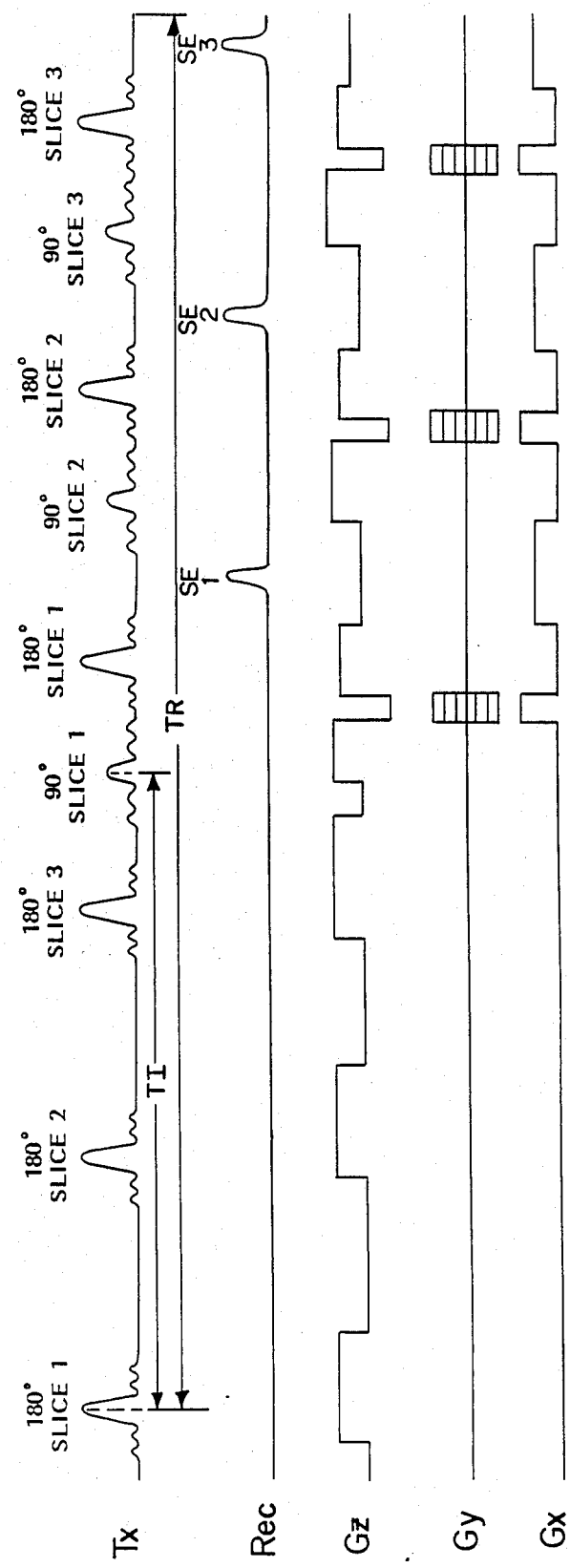
FIGS. 2A and 2B are schematic timing diagrams for prior art multi-slice inversion recovery sequences.
Figure 2B:
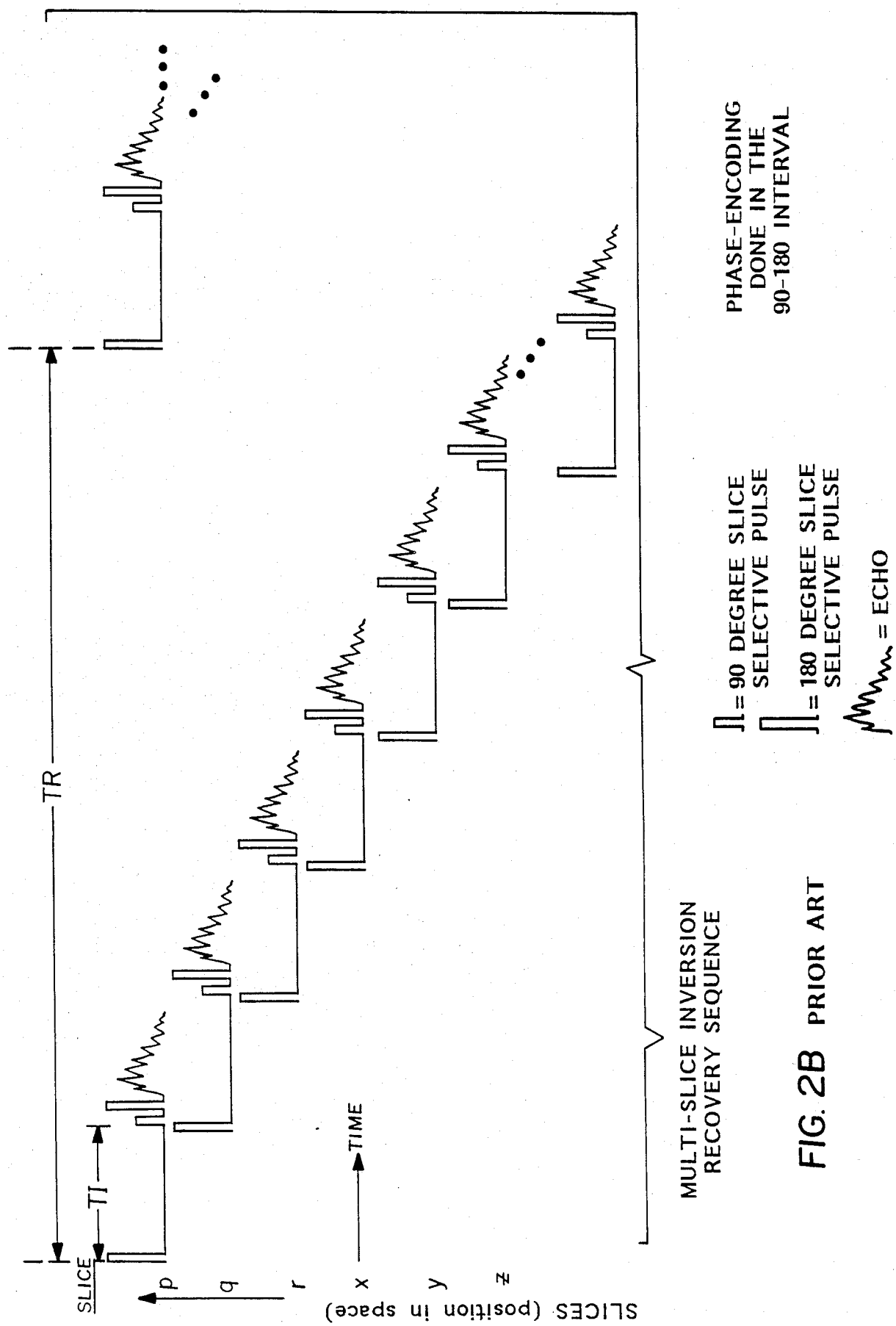

Typically, a human or animal subject (or other object) 10 is inserted along the z-axis of a static magnet 8 (in some current permanent magnetic MRI systems, the static magnetic field would be aligned with the y-axis as shown in FIG. 1) which establishes a substantially uniform magnetic field directed along the z-axis within the portion of the object 10 of interest. For example, contiguous parallel slice-volumes p, q . . . z may be located within the volume to be imaged (albeit the slice-volumes need not be contiguous or sequential). Gradients may be imposed within this z-axis directed magnetic field along mutually orthogonal x,y,z axes by a set of x,y,z gradient amplifiers and coils 14. NMR RF signals are transmitted into the body 10 and NMR RF responses are received from the body 10 via RF coils 16 connected by a conventional transmit/receive switch 18 to an RF transmitter 20 and RF receiver 22. As will be appreciated by those in the art, separate transmit and receive coils may be used in some installations in which case the T/R switch 18 is not needed.

All of the prior mentioned elements may be controlled, for example, by a control computer 24 which communicates with a data acquisition and display computer 26. The latter computer 26 may also receive NMR RF responses via an analog-to-digital converter 28. A CRT display and keyboard unit 30 is typically also associated with the data acquisition and display computer 26.

As will be apparent to those in the art, such an arrangement may be utilized so as to generate desired sequences of magnetic gradient pulses and NMR RF pulses and to measure the desired NMR RF responses in accordance with stored computer programs. As depicted in FIG. 1, the MRI system of this invention will typically include RAM, ROM and/or other stored program media adapted (in accordance with the following descriptions) so as to generate short TR interleaved imaging sequences and to process resulting MRI data (e.g., in accordance with conventional image reconstruction algorithms).

Figure 3:
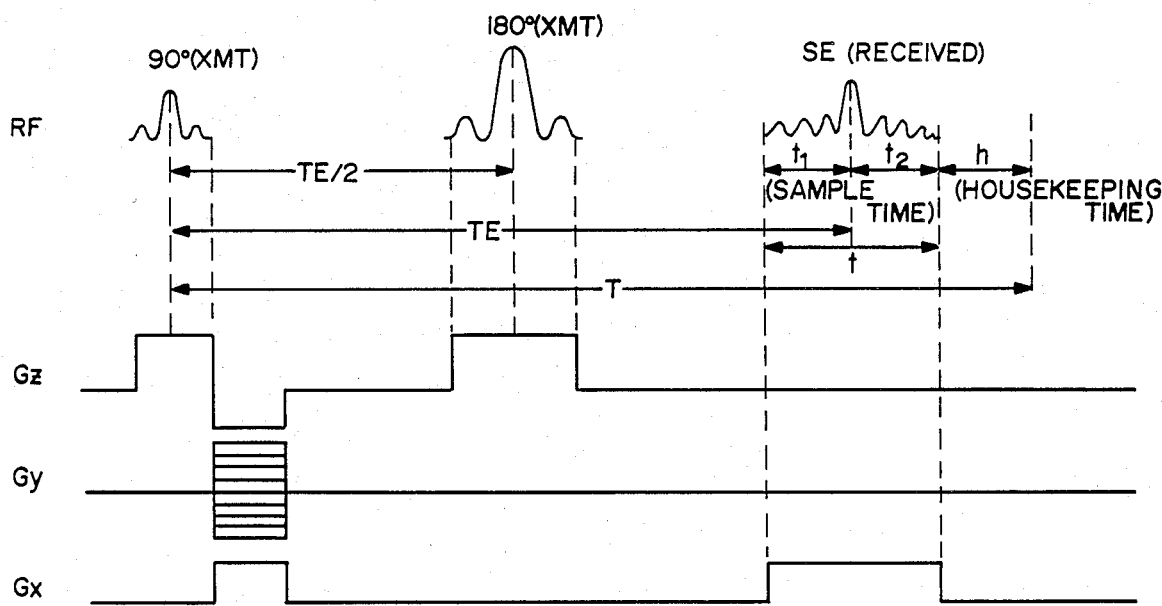
FIG. 3 is a schematic timing diagram for typical prior art NMR measurement cycles used to elicit and measure spin echo responses from a selected single slice volume.

FIG. 3 depicts a typical prior art 90°-180° spin echo NMR measurement cycle including a general schematic depiction of slice selective $G_z$ gradients (and a suitable phase correction $G_z$ reverse polarity pulse), phase encoding $G_y$ pulses (e.g., a different phase encoding $G_y$ value would be used for each different measurement cycle so as to obtain a different "projection" for use in 2DFT MRI image reconstruction) and the usual $G_x$ pulse during spin echo readout time (e.g., so as to provide phase encoding along the x dimension axis).

As depicted in FIG. 3, a typical spin echo measurement cycle begins with a 90° NMR RF nutation pulse followed at a time TE/2 by a 180° NMR RF nutation pulse so as to generate a spin echo NMR RF response at time TE. The spin echo (SE) persists and is repetitively sampled (and converted to digital form) during a measurement window t (commonly being TE). The total time T for a given measurement cycle (i.e., to elicit a single spin echo from a single slice-volume) is thus $T=TE+t_2+h$, where h is a short time typically used for various housekeeping purposes required to set the system up for the next measurement cycle.

Typical known formulas for expected signal strength are also depicted in FIG. 3.

Figure 4:
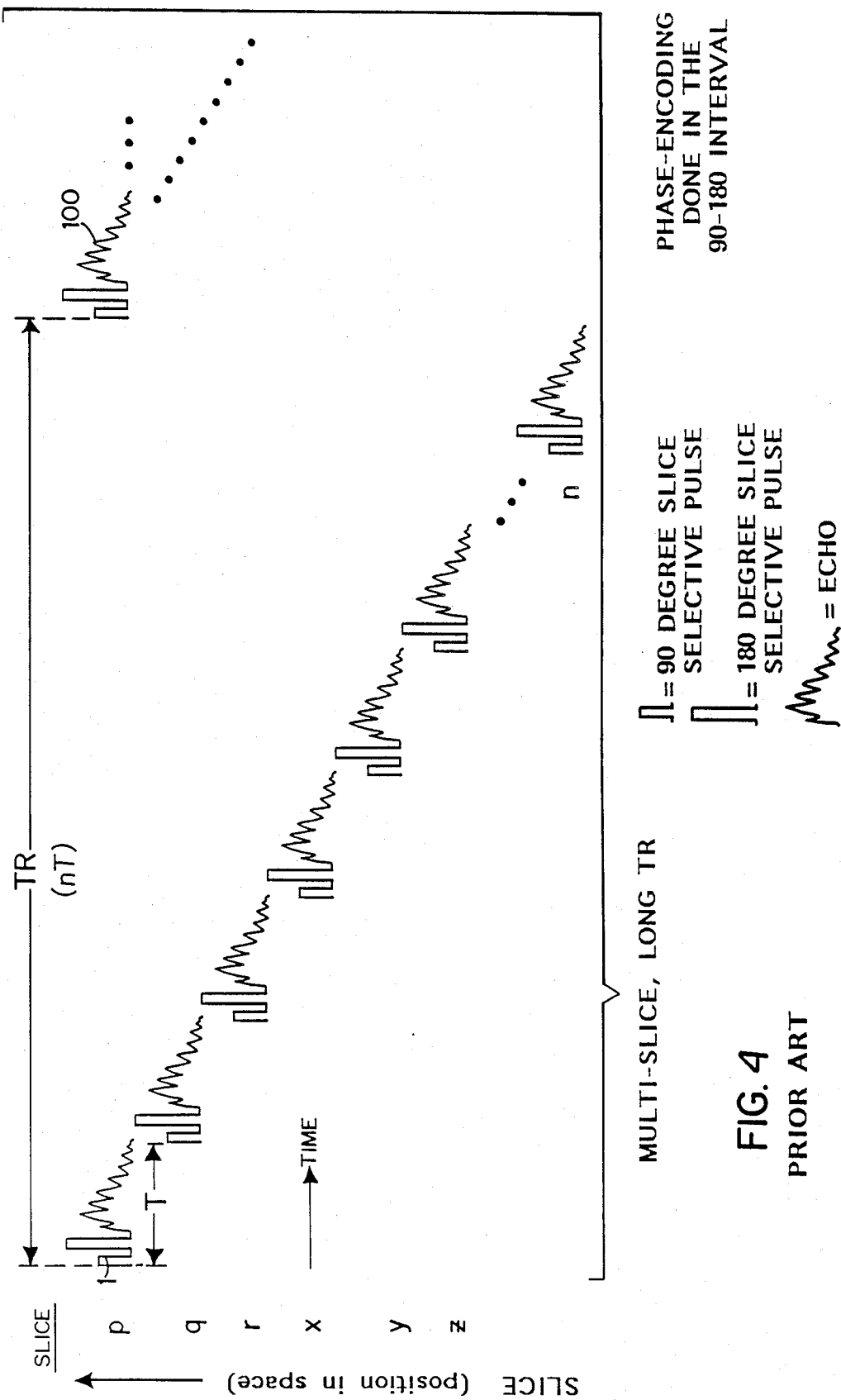
FIG. 4 is a schematic depiction of a typical multi-slice MRI sequence achievable for relatively long effective TR parameters in accordance with the prior art (e.g., the earlier referenced related Crooks et al patents)

In commonly encountered situations, the desired TR parameter can be much longer than T. In such circumstance, a typical Crooks et al multi-slice imaging technique as depicted in FIG. 4 permits repetition of the single slice measurement cycle in another slice-volume of the imaged object, repeating the measurement cycle process n times so that the effective and actual TR=nT. As also depicted in FIG. 4, the entire multi-slice measurement cycle is then started again (e.g., at 100) and is typically repeated a very large number of times (e.g., 256) so as to obtain sufficient phase-encoded projection data for reconstructing an MRI image.

Figure 5:
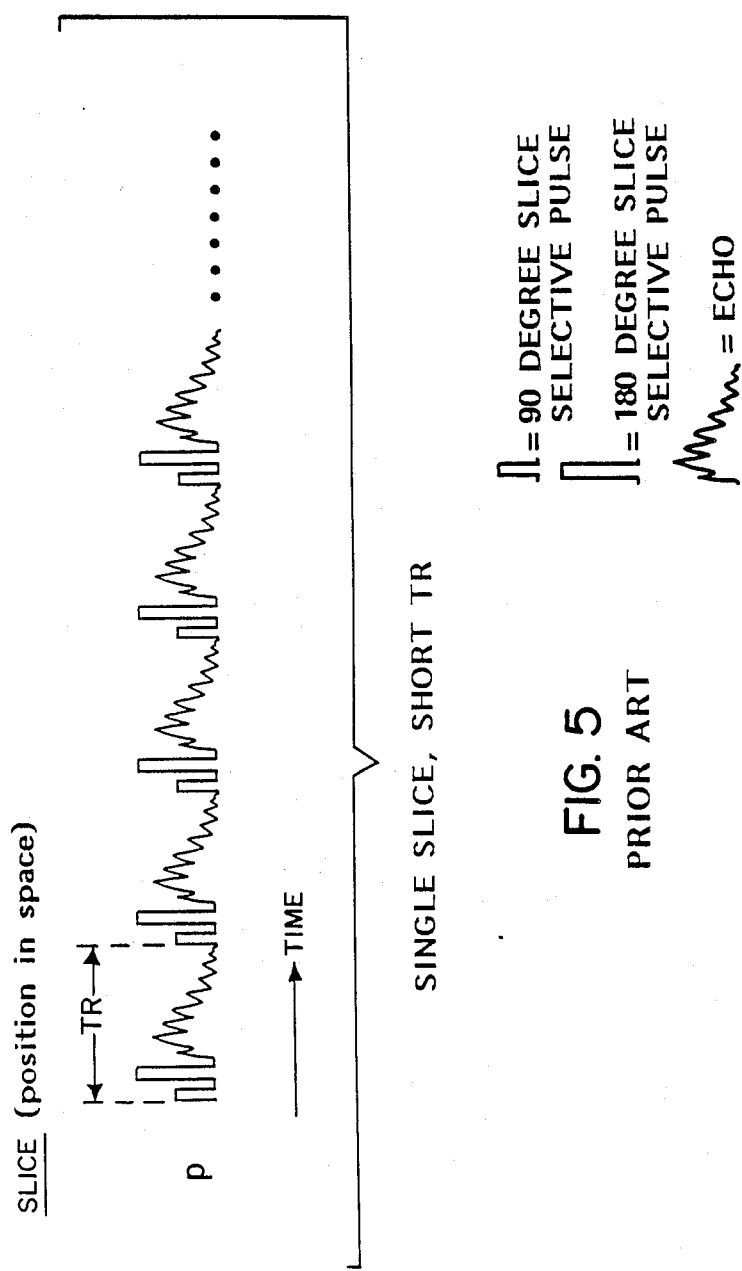
FIG. 5 is a schematic depiction of typical prior art single slice volume MRI measurement sequences for relatively short effect TR parameters.

However, when the desired effective TR is relatively short (e.g., 50-100 milliseconds), the permissible number of slice volumes which may be treated in the Crooks et al multi-slice sequence becomes quite small (e.g., only one or two). A case where n=1 is depicted in FIG. 5 as one typical prior art approach for obtaining an effectively small TR parameter (e.g., as may be required for imaging contrast media tissues as explained above). Since many slice volumes p,q ... z typically must be imaged so as to cover the relevant anatomy of interest, the relatively short TR sequence of FIG. 5 must be repeated a number of times and data for images of slice volumes is obtained sequentially instead of in the multi-slice mode of Crooks et al as in FIG. 4.

Of course, the earlier mentioned Wehrli et al sequences might also be used to obtain shorter TR—but would appear to effectively "waste" the TR time between 90° pulses.

Unfortunately, for reasons explained above, when such short TR sequences are utilized as in FIG. 5, the effective signal-to-noise ratio of the NMR RF responses is considerably degraded (e.g., by 30% to 40%). To avoid such degradation, the multi-slice short TR sequence of this invention may be utilized as depicted in FIG. 6.

Here, instead of the prior art FIG. 5 sequence with a succession of 90°-180° RF nutation pulses, each slice volume is addressed with a sequence of 90°-90°-180° RF nutation pulses. Accordingly, the *effective* TR parameter for NMR signal responses is the time interval between the 90° RF nutation pulses. However, the TE parameters (e.g., the interval between the second 90° nutation pulse and the 180° nutation pulse) may be made as short as desired and the actual repetition interval TR between repetitions of a multi-slice measurement cycle may again be made equal to nW where W is the time between 90° pulses addressed to successive ones of the slice volumes and n is the number of slice volumes addressed in a complete multi-slice measurement cycle.

Figure 6A:
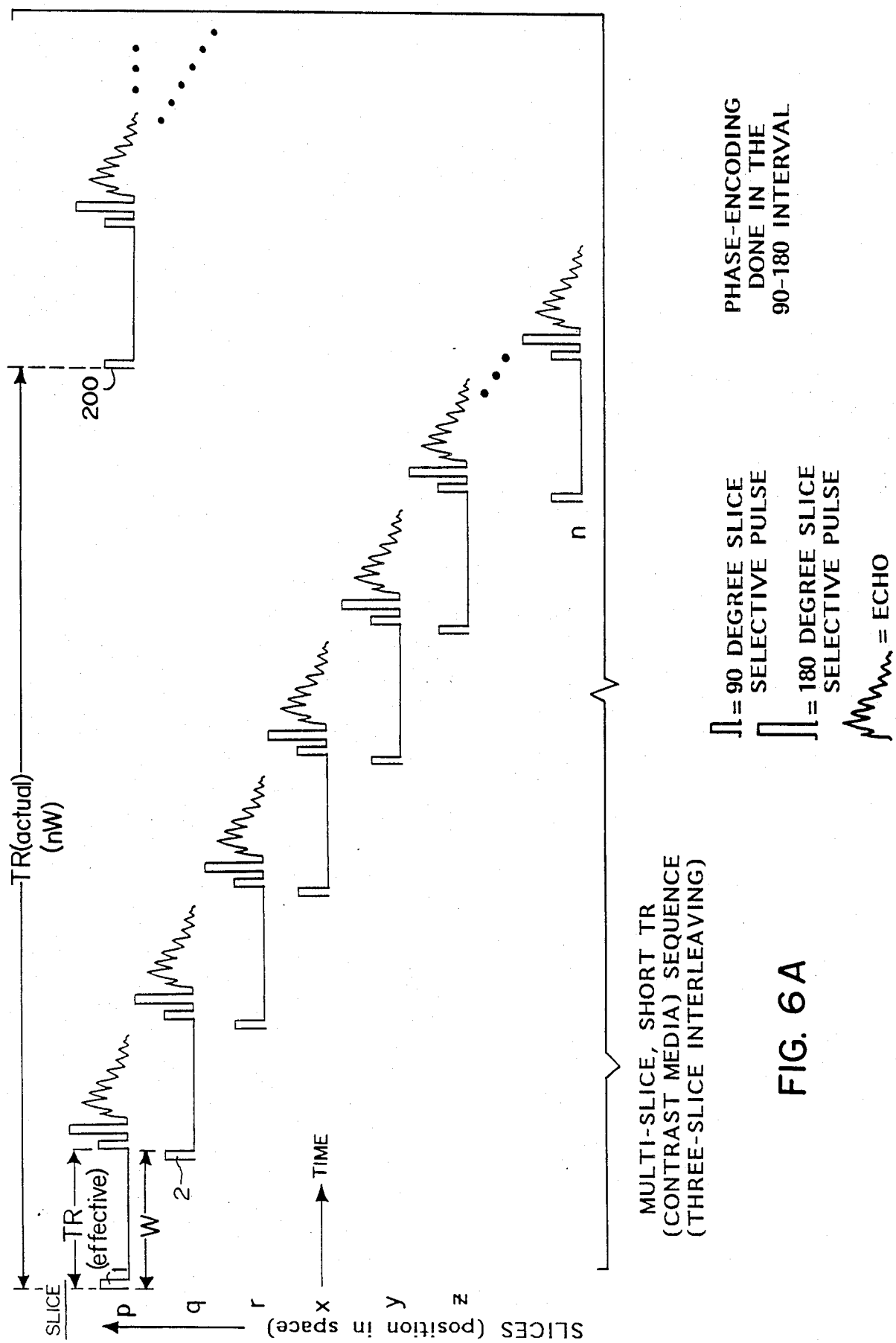
FIGS. 6A and 6B are schematic depictions of exemplary multi-slice short TR MRI sequences in accordance with this invention.

The length of the actual measurement cycle within a given single slice-volume is $T=TR(effective)+TE+t_2+h$ where the parameters $TE,t_2$ and h meanings as previously described in connection with FIG. 3 and where TR (effective) is depicted in FIG. 6 as the time between 90° nutation pulses in a given single-slice volume. Accordingly, for any given single slice volume, this technique increases the time between the 180° RF nutation and the next 90° nutation pulse by introducing the TR(actual)−W time interval. In this manner, the inherent signal loss in short TR spin echo NMR measurement cycle sequences is avoided.

At the same time, the added "dead time" which defines the effective TR is effectively utilized by acquiring spin echoes from *other* slice volumes during this time interval and by initiating similar sequence(s) in yet further slice(s). Of course, there will be "end effects" at the beginning of an entire sequence when one TR time may still be "wasted." However, these end effects are typically small (e.g., for ten slices, 120 projections, the end effect is less than 0.1%).

For example, as depicted in FIG. 6, the first measurement sequence begins at 1 with a slice selective (e.g., slice p) 90° NMR RF nutation pulse. At a time TR later, the actual 90°-180° nutation pulse sequence used for eliciting a spin echo from that particular slice (e.g., p) will be generated. However, in the meantime during the TR interval for slice p, the initial 90° nutation pulse 2 for slice q is transmitted and, during the TR interval which ensues for this next slice q, the 90°-180°-spin echo SE sequence is achieved for slice p. Also, during TR for slice q, the initial 90° pulse is effected for slice r. This doubly "interleaved" process is repeated for successive n slices p,q ... z, etc., until the last slice-volume of the multi-slice data gathering cycle is reached. Here, the next cycle 200 of the multi-slice sequence is started by a slice selective 90° nutation pulse during the TR interval of slice z. In this manner, a substantially continuous succession of multi-slice NMR measurement cycles may be repeated as many times as desired (e.g, 256) so as to time efficiently obtain MRI imaging data without signal degradation in spite of relatively short TR sequence parameters.

In brief summary, although each slice volume experiences a 90°-TR(eff)-90°-TE/2-180°-TE/2-SE sequence, the "dead" time of the TR(eff) waiting interval within any given single slice-volume (except the first projection of the first slice) is constructively used so as receive and to elicit spin echo NMR RF responses from other slice-volumes. The actual TR which determines the real overall scan time for the complete multi-slice sequence depends upon how many times the advance or "interleaved" 90° nutation pulse is used (i.e., the number of different slice volumes addressed in the overall multi-slice sequence) and the TE parameter. As should be appreciated, the *actual* TR can be as long as necessary to acquire the desired number of slice volume data sets without affecting the T1 dependent *effective* TR.

Accordingly, the multi-slice short TR sequence of FIG. 6 permits multi-slice MRI data acquisition in a time which is comparable to that required for an equal number of single slice volume sequences (e.g., as in the prior art FIG. 5) but while achieving the desired short TR *without* degrading the signal-to-noise ratio (e.g., by about 30° to 40° in the FIG. 5 prior art approach).

As earlier mentioned, although the preferred exemplary embodiment utilizes an initial pair of 90° RF nutation pulses prior to 180° nutation, other initial "partial" NMR nutation angles are also feasible. Furthermore, although the preferred exemplary embodiment utilizes a 180° RF nutation pulse for achieving 180° nutation of the NMR nuclei, similar 180° nutation of these nuclei may be achieved in known manners by using gradient reversal techniques. And, although the exemplary embodiment depicts sequential addressing of contiguous slice volumes p,q ... z, the slice volumes need not be contiguous nor need they be addressed in a sequential fashion. As should also be apparent, if the TR(eff) intervals are sufficiently long, then more than one spin echo (e.g., possibly from different or the same slice volumes) might be elicited during the TR(eff) interval of another slice volume.

Figure 6B:
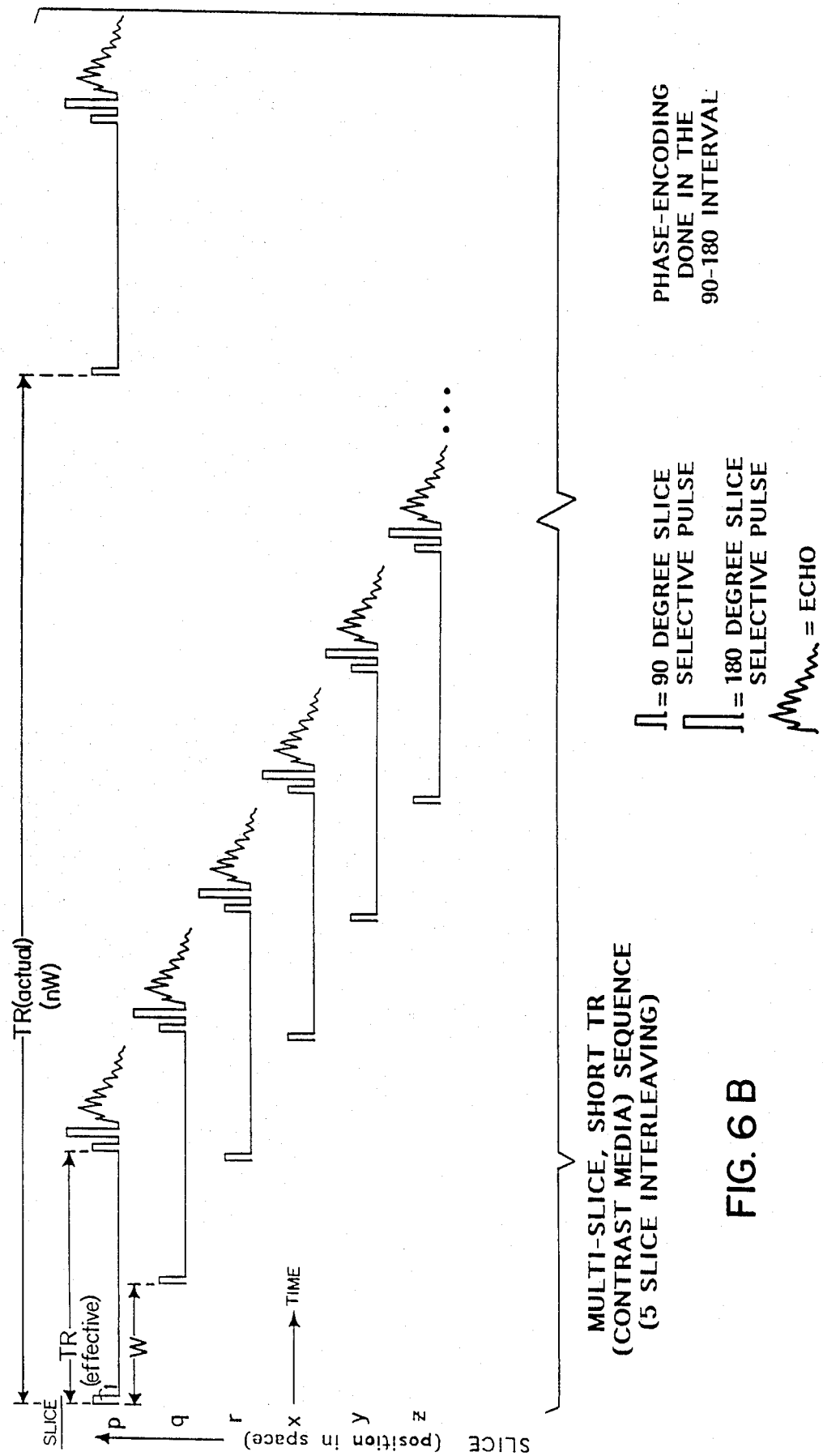

FIG. 6B depicts a triple interleaved embodiment of this invention where, after end effects are ignored, during each TR (effective) interval SE's are elicited and recorded from a *pair* of prior slices while a *pair* of subsequent slices also receive their precursor 90° nutation pulses.

While only a few exemplary embodiments of this invention have been described in detail, those skilled in the art will recognize that many variations and modifications may be made in these exemplary embodiments while yet retaining many of the novel features and advantages of this invention. Accordingly, all such variations and modifications are intended to be included within the scope of the appended claims.

What is claimed is:

1. A magnetic resonance imaging method for enhanced contrast media imaging comprising:
   transmitting a sequence of $\theta°-\phi°-180°$ slice-selective NMR RF nutation pulses into each of plural parallel slice-volumes of tissue to be imaged, both $\theta°$ and $\phi°$ being substantially different from 180° in magnitude, and receiving from each said slice-volume an NMR RF response resulting therefrom;
   said nutation pulses and NMR RF response for at least a given one of said slice-volumes being interleaved, in time, with (a) $\phi°-180°$ nutation pulses and an NMR RF response from at least one other of said slices-volumes and (b) at least one initial $\theta°$ nutation pulse for at least one further of said slice-volumes such that at least one NMR RF response from one said slice-volume is received between slice-selective NMR RF nutation pulses directed to two other of said slice-volumes.

2. A magnetic resonance imaging method as in claim 1 wherein:
   each slice-volume receives a $\theta°$ nutation pulse, followed after a time interval TR, by a $\phi°$ nutation pulse, followed after a further time interval TE/2, by 180° nutation reversal, where, during and after another TE/2 time interval, such slice-volume produces a spin echo NMR RF response SE for a time interval t;
   the $\phi°$ nutation pulse and the TE and t time intervals for a given first slice volume occur during the effective TR time interval for a second slice-volume; and
   the $\theta°$ nutation pulse for yet a third slice-volume also occurs during the TR effective time interval for said second slice-volume.

3. A magnetic resonance imaging method as in claim 2 wherein $\theta°$ and $\phi°$ are each approximately 90°.

4. A magnetic resonance imaging method as in claim 1 wherein plural contiguous slice-volumes are sequentially processed, the $\phi°$ nutation pulse and the TE and t time intervals for the nth contiguous slice-volume occurring during the effective TR time interval for the (n+m)st slice-volume while the $\theta°$ nutation pulse for the (n+p)nd slice-volume also occurs during effective TR time interval for the (n+m)st slice-volume.

5. A magnetic resonance imaging method as in claim 1 wherein the $\phi°$ nutation pulse and the TE and t time intervals for plural slice volumes occur during the TR effective time interval for a single other slice volume.

6. A magnetic resonance imaging method for enhancing the effect of image contrast media acting to reduce T1 and T2 NMR parameters of tissue being imaged by producing an effectively shortened TR imaging parameter within a multi-slice MRI imaging procedure, said method comprising the steps of:
   transmitting at least one NMR RF nutation pulse substantially different from 180° into a first slice-volume of tissue to be imaged and waiting a first predetermined time interval before transmitting first additional NMR RF nutation pulses including a substantially 180° pulse into said first slice volume and subsequently receiving first NMR RF responses from said slice-volume in response thereto; and
   during said first predetermined time interval, transmitting at least one NMR RF nutation pulse substantially different from 180° into a different second slice volume of tissue and waiting a second predetermined time interval before transmitting second additional NMR RF nutation pulses including a substantially 180° pulse into said second slice volume and subsequently receiving second NMR RF responses from said second slice volume in response thereto;

said first additional NMR RF nutation pulses and said first NMR RF responses occurring during said second time interval;

also during said second time interval transmitting at least one NMR RF nutation pulse substantially different from 180° into a third slice-volume of tissue to be imaged; and thereafter waiting a third predetermined time interval before transmitting third additional NMR RF nutation pulses including a substantially 180° pulse into said third slice-volume and subsequently receiving third NMR RF responses from said third slice-volume in response thereto.

7. A magnetic resonance imaging method for enhancing the signal-to-noise ratio of received NMR RF responses by making the effective TR NMR sequence parameter substantially less than the actual repetition interval between measurement cycles, said method comprising the steps of:

using a plurality of successive slice-selective $\theta°$-$\phi°$-180° NMR nutation sequences, where 0° is substantially different from 180°, for eliciting a spin echo NMR response from each slice-volume where the effective TR is the time interval between the $\theta°$-$\phi°$ nutations and TE/2 is the time between the $\phi°$ nutation and the 180° nutation and where, during the effective TR time interval for a first slice-volume, (a) the spin echo response for at least a second slice-volume is received and (b) the $\theta°$ nutation of at least a third slice-volume is effected thereby increasing the time elapsed between a 180° nutation and the next $\phi°$-180° nutation for a given slice while usefully employing the effective TR time interval for a given slice-volume by therein performing completing and beginning portions of similar NMR imaging sequences for at least two other slice-volumes.

8. A magnetic resonance imaging method for enhancing the signal-to-noise ratio of received NMR RF responses for relatively short TR NMR sequence parameters, said method comprising the steps of:

(i) performing a slice-selective $\theta°$ NMR RF nutation in a predetermined slice volume, $\theta°$ being substantially different from 180°;

(ii) waiting a predetermined time TR before again addressing said predetermined slice volume with another slice selective $\phi°$ NMR RF nutation;

(iii) waiting a time TE/2 much shorter than TR before causing a 180° NMR nutation in said predetermined slice volume; and (iv) subsequently receiving a spin echo NMR RF response form said predetermined slice volume whereby the time elapsed between a 180° nutation and the next $\phi°$-180° nutation for a given slice is increased thereby maintaining a relatively high signal-to-noise ratio for the received spin echo RF response while still providing a relatively short effective TR, and (v) repeating steps (i)-(iv) for a succession of other slice-volumes where step (iv) for an nth slice-volume occurs during step (ii) for an (n+p)st slice-volume and step (i) for an nth slice-volume occurs during step (ii) for an (m−p)st slice-volume.

9. A magnetic resonance imaging apparatus for enhanced contrast media imaging comprising:

means for transmitting a sequence of $\theta°$-$\phi°$-180° slice-selective NMR RF nutation pulses into each of plural parallel slice-volumes of tissue to be imaged, both $\theta°$ and $\phi°$ being substantially different from 180° in magnitude, and for receiving from each said slice-volume an NMR RF response resulting therefrom;

means for interleaving said nutation pulses and NMR RF response for at least a given one of said slice-volumes, in time, with (a) $\phi°$-180° nutation pulses and an NMR RF response from at least one other of said slices-volumes and (b) at least one initial $\theta°$ nutation pulse for at least one further of said slice-volumes such that at least one NMR RF response from one said slice-volume is received between slice-selective NMR RF nutation pulses directed to two other of said slice-volumes.

10. A magnetic resonance imaging apparatus for enhancing the effect of image contrast media acting to reduce T1 and T2 NMR parameters of tissue being imaged by producing an effectively shortened TR imaging parameter within a multi-slice MRI imaging procedure, said apparatus comprising:

means for transmitting at least one NMR RF nutation pulse substantially different from 180° into a first slice-volume of tissue to be imaged and waiting a first predetermined time interval before transmitting first additional NMR RF nutation pulses including a substantially 180° pulse into said first slice volume and for subsequently receiving first NMR RF responses from said slice-volume in response thereto;

means for transmitting, during said first predetermined time interval, at least one NMR RF nutation pulse substantially different from 180° into a different second slice volume of tissue and waiting a second predetermined time interval before transmitting second additional NMR RF nutation pulses including a substantially 180° pulse into said second slice volume and subsequently receiving second NMR RF responses from said second slice volume in response thereto;

said first additional NMR RF nutation pulses and said first NMR RF responses occurring during said second time interval; and means for also transmitting, during said second time interval, at least one NMR RF nutation pulse substantially different from 180° into a third slice-volume of tissue to be imaged and thereafter waiting a third predetermined time interval before transmitting third additional NMR RF nutation pulses including a substantially 180° pulse into said third slice-volume and subsequently receiving third NMR RF responses from said third slice-volume in response thereto.

11. A magnetic resonance imaging apparatus for enhancing the signal-to-noise ratio of received NMR RF responses by making the effective TR NMR sequence parameter substantially less than the actual repetition interval between measurement cycles, said apparatus comprising:

means for transmitting a plurality of successive slice-selective $\theta°$−$\phi°$−180° NMR nutation sequences, where $\theta°$ is substantially different from 180°, for eliciting a spin echo NMR response from each slice-volume where the effective TR is the time interval between the $\theta°$-$\phi°$ nutations and TE/2 is the time between the $\phi°$ nutation and the 180° nutation and where, during the effective TR time interval for a first slice-volume, (a) the spin echo response for at least a second slice-volume is received and (b) the $\theta°$ nutation of at least a third slice-volume is effected thereby increasing the time elapsed between a 180° nutation and the next $\phi°$-180° nutation for a given slice while usefully employing the effective TR time interval for a given slice-volume by therein performing completing and beginning portions of similar NMR imaging sequences for at least two other slice-volumes; and means for receiving and processing said spin echo responses into an MRI image.

12. A magnetic resonance imaging apparatus for enhancing the signal-to-noise ratio of received NMR RF responses for relatively short TR NMR sequence parameters, said apparatus comprising:

(i) means for performing a slice-selective $\theta°$ NMR RF nutation in a predetermined slice volume, $\theta°$ being substantially different from 180°;

(ii) means for waiting a predetermined time TR before again addressing said predetermined slice volume with another slice selective $\theta°$ NMR RF nutation;

(iii) means for waiting a time TE/2 much shorter than TR before causing a 180° NMR nutation in said predetermined slice volume;

(iv) means for subsequently receiving a spin echo NMR RF response from said predetermined slice volume whereby the time elapsed between a 180° nutation and the next $\phi°$-180° nutation for a given slice is increased thereby maintaining a relatively high signal-to-noise ratio for the received spin echo RF response while still providing a relatively short effective TR, and (v) means for causing the means of paragraphs (i)-(iv) to operate repeatedly for a succession of other slice-volumes where means (iv) for an nth slice-volume operates during operation of means (ii) for an (n+p)st slice-volume and means (i) for an nth slice-volume operates during operation means (ii) for an (m−p)st slice-volume.

* * * * *

UNITED STATES PATENT AND TRADEMARK OFFICE
CERTIFICATE OF CORRECTION

PATENT NO. : 4,851,778

DATED : 25 July 1989

INVENTOR(S) : Leon KAUFMAN and Chris BRAGG

It is certified that error appears in the above-identified patent and that said Letters Patent is hereby corrected as shown below:

Cover sheet, item [22] should read:

"Filed: December 15, 1988".

Signed and Sealed this

Twenty-sixth Day of December, 1989

*Attest:*

JEFFREY M. SAMUELS

*Attesting Officer*     *Acting Commissioner of Patents and Trademarks*